United States Patent [19]  [11] Patent Number: 4,876,661
Koya  [45] Date of Patent: Oct. 24, 1989

[54] ARITHMETIC LOGIC SYSTEM CAPABLE OF CHECKING CARRY LOOK-AHEAD CIRCUIT

[75] Inventor: Kei Koya, Tokyo, Japan
[73] Assignee: NEC Corporation, Tokyo, Japan
[21] Appl. No.: 187,180
[22] Filed: Apr. 28, 1988
[30] Foreign Application Priority Data
  Apr. 28, 1987 [JP] Japan .................. 62-105821
[51] Int. Cl.⁴ .................................. G06F 7/50
[52] U.S. Cl. .................................... 364/787
[58] Field of Search ................. 364/784, 786, 787
[56] References Cited
  U.S. PATENT DOCUMENTS
  4,763,295  8/1988  Yamada et al. ............ 364/787

Primary Examiner—Gary V. Harkcom
Assistant Examiner—Long T. Nguyen
Attorney, Agent, or Firm—Sughrue, Mion, Zinn, Macpeak & Seas

[57] ABSTRACT

An arithmetic logic system includes a plurality of arithmetic logic units for processing data composed of a corresponding number of bits and having a path for transferring a carry through the respective arithmetic logic units, and a carry look-ahead circuit provided in parallel to the carry transfer path and having inputs respectively connected to the arithmetic logic units for generating a carry look-ahead signal when a carrry look-ahead condition is realized. A carry signal output is connected to a most upstream end of the carry transfer path, and a first transfer gate is connected at its one end to the carry signal output and at its other end to a predetermined voltage. The first transfer gate operates in response to the carry look-ahead signal so as to connect the carry signal output to the predetermined voltage. A second transfer gate is connected between the carry signal output and the most upstream end of the carry transfer path. This second tranfer gate operates in response to a test mode signal to isolate the carry signal output from the carry transfer path so that the carry is transferred through only the carry look-ahead circuit. Therefore, if any failure occurs in the carry look-ahead circuit, an error will be generated in the result of operation on the arithmetic logic system.

7 Claims, 2 Drawing Sheets

ARITHMETIC LOGIC SYSTEM CAPABLE OF CHECKING CARRY LOOK-AHEAD CIRCUIT

BACKGROUND OF THE INVENTION

1. Field of the invention

The present invention relates to an arithmetic logic system, and more specifically to a test circuit for a carry look-ahead circuit incorporated in the arithmetic logic system.

2. Description of related art

One recent large demand to data processing apparatuses such as microprocessors is to be able to process a large amount of data at a high speed. Considering this demand on arithmetic logic systems contained in the microprocessors, a high speed processing of a large amount of data is not so easy becuase it needs an increased capacity of carry lines. As one means for solving this problem, a carry look-ahead has been proposed.

In fact, this carry look-ahead can speed up the operation of the arithmetic logic system. However, in the case that a carry look-ahead circuit is used in the microprocessors, since the carry look-ahead circuit is redundant in comparison with the conventional carry transfer circuit, it is very difficult to know a failure in the carry look-ahead circuit from the outside of the microprocessor.

Specifically, in the microprocessor having the carry look-ahead circuit, if the carry look-ahead circuit does not properly operate, the operation speed of the microprocessor is lowered. Therefore, when any failure occurs in the carry look-ahead circuit, if a dispersion or scattering of the operation speed can be observed from the outside of the microprocessor. However, the dispersion or scattering of the operation speed will occur due to various causes other than the failure in the carry look-ahead circuit. Accordingly, it is not allowed to conclude from only the dispersion or scattering of the operation speed that any failure has occurred in the carry look-ahead circuit.

SUMMARY OF THE INVENTION

Accordingly, it is an object of the present invention to provide an arithmetic logic system which has overcome the above mentioned defect of the conventional one.

Another object of the present invention is to provide an additional test circuit provided to an arithmetic logic system, which circuit is capable of testing the operation of the carry look-ahead circuit provided in the arithmetic logic system.

Still another object of the present invention is to provide an additional test circuit provided to an arithmetic logic system, which circuit is composed of a small amount of circuit elements and is capable of testing the operation of the carry look-ahead circuit provided in the arithmetic logic system without injuring the operation of the arithmetic logic system when it is a non-testing condition.

A further object of the present invention is to provide a test circuit is capable of testing whether or not a selected portion of the carry look-ahead circuit properly functions.

The above and other objects of the present invention are achieved in accordance with the present invention by an arithmetic logic system which includes a plurality of arithmetic logic units for precessing data composed of a corresponding number of bits and having a path for transferring a carry through the inside of the respective arithmetic logic units, and a carry look-ahead circuit provided in parallel to the carry transfer path and having inputs respectively connected to the arithmetic logic units for generating a carry look-ahead signal when a carry look-ahead condition is realized, comprising a carry signal output connected to a most upstream end of the carry transfer path, a first transfer gate connected at its one end to the carry signal output and at its other end to a predetermined voltage and operating in response to the carry look-ahead signal so as to connect the carry signal output to the predetermined voltage, and a second transfer gate connected between the carry signal output and the most upstream end of the carry transfer path and operating in response to a test mode signal to isolate the carry signal output from the carry transfer path.

With the above mentioned arrangement, if the test mode signal is applied, the second transfer gate is turned off so as to isolate the carry signal output from the carry transfer path. In this condition, a carry generated on the basis of the result of operation in the respective arithmetic logic units will transferred through only the carry look-ahead circuit. Accordingly, only when the carry look ahead condition is realized or fulfilled, the carry look-ahead circuit generates the carry look-ahead signal indicative of the realization of the carry look-ahead condition, and therefore, the first transfer gate is turned on, so that the carry signal output is connected to the predetermined voltage so as to output a carry signal.

However, if there is any failure in the carry look-ahead circuit, since the carry look-ahead circuit will not generate the carry look-ahead signal even if the carry look ahead condition is realized or fulfilled, namely when the carry should be outputted from the arithmetic logic system. In this situation, on the other hand, since the second transfer gate is maintained off as mentioned above, the carry signal will not be outputted from the carry signal output, with the result that the result of the operation is in error. Accordingly, whether or not the carry look-ahead circuit is in failure or fault by monitoring the result of the operation.

In a preferred embodiment of the arithmetic logic system as mentioned above, the least significant bit arithmetic logic unit of the arithmetic logic units has a carry input connected to ground through a third transfer gate whose gate is connected to receive a clock, and the most significant bit arithmetic logic unit of the arithmetic logic units has a carry output connected through the second transfer gate to the carry signal output. In addition, each pair of adjacent arithmetic logic units are connected in such a manner that a carry output of a less significant bit arithmetic logic unit of the arithmetic logic unit pair is connected to a carry input of a more significant bit arithmetic logic unit of the arithmetic logic unit pair.

Preferably, the other end of the first transfer gate is connected to ground, and the carry look-ahead circuit includes a NOR circuit having and at least three inputs and an output which is connected to a gate of the first transfer gate. Two inputs of the NOR circuit are connected to the carry input and the carry output of the least significant bit arithmetic logic unit, respectively, and the other inputs of the NOR circuit are connected to operation outputs of the other arithmetic logic units through inverters, respectively.

According to another aspect of the present invention, there is provided an arithmetic logic system comprising:

a plurality of arithmetic logic unit blocks each of which receive a pair of input data composed of a plurality of bits and having a carry input, a carry output and a plurality of operation outputs corresponding to the bit number of each input data, each pair of arithmetic logic unit blocks being connected in such a manner that the carry output of a less significant bit arithmetic logic unit block of the arithmetic logic unit block pair is connected to the carry input of a more significant bit arithmetic logic unit block of the arithmetic logic unit block pair, a carry signal output connected to the carry output of the most significant bit arithmetic logic unit block through a first transfer gate which operates in response to a test mode signal to interrupt between the carry signal output and the most significant bit arithmetic logic unit block;

a carry look-ahead circuit in response to the operation outputs of the arithmetic logic unit blocks for generating a carry look-ahead signal when a carry look-ahead condition is realized; and a second transfer gate connected at its one end to an output of the carry signal output and at its other end to a predetermined voltage and operating in response to the carry look-ahead signal so as to connect the output of the carry signal output to the predetermined voltage, whereby when the carry signal output is separated from the carry output of the most significant bit arithmetic logic unit block by the first transfer gate, a carry is transferred through only the carry look-ahead circuit, and if any failure occurs in the carry look-ahead circuit, an error will be generated in the result of operation on the arithmetic logic system.

Specifically, the carry output of the less significant bit arithmetic logic unit block of each arithmetic logic unit block pair is connected to the carry input of the more significant bit arithmetic logic unit block of each arithmetic logic unit block pair, through a third transfer gate which operates in response to the test mode signal to interrupt between the pair of arithmetic logic unit blocks pair.

Preferably, each arithmetic logic unit block pair includes a fourth transfer gate connected at its one end to a predetermined voltage and at its other end to the carry input of the more significant bit arithmetic logic unit block of each arithmetic logic unit block pair, and a NOR gate having an output connected to a gate of the fourth transfer gate. The NOR gate has two inputs, one of which is connected to the carry output of the next less significant bit arithmetic logic unit block adjacent to the less significant bit arithmetic logic unit block of each arithmetic logic unit block pair. There is also provided a NAND circuit having an output connected to the other input of the NOR circuit and inputs connected to the operation outputs of the less significant bit arithmetic logic unit block of each arithmetic logic unit block pair.

In addition, the second transfer gate having a gate connected an output of a NOR gate whose inputs are connected to outputs of the respective NAND circuits.

The above and other objects, features and advantages of the present invention will be apparent from the following description of preferred embodiments of the invention with reference to the accompanying drawings.

DESCRIPTION OF THE PREFERRED EMBODIMENT

Figure 1:
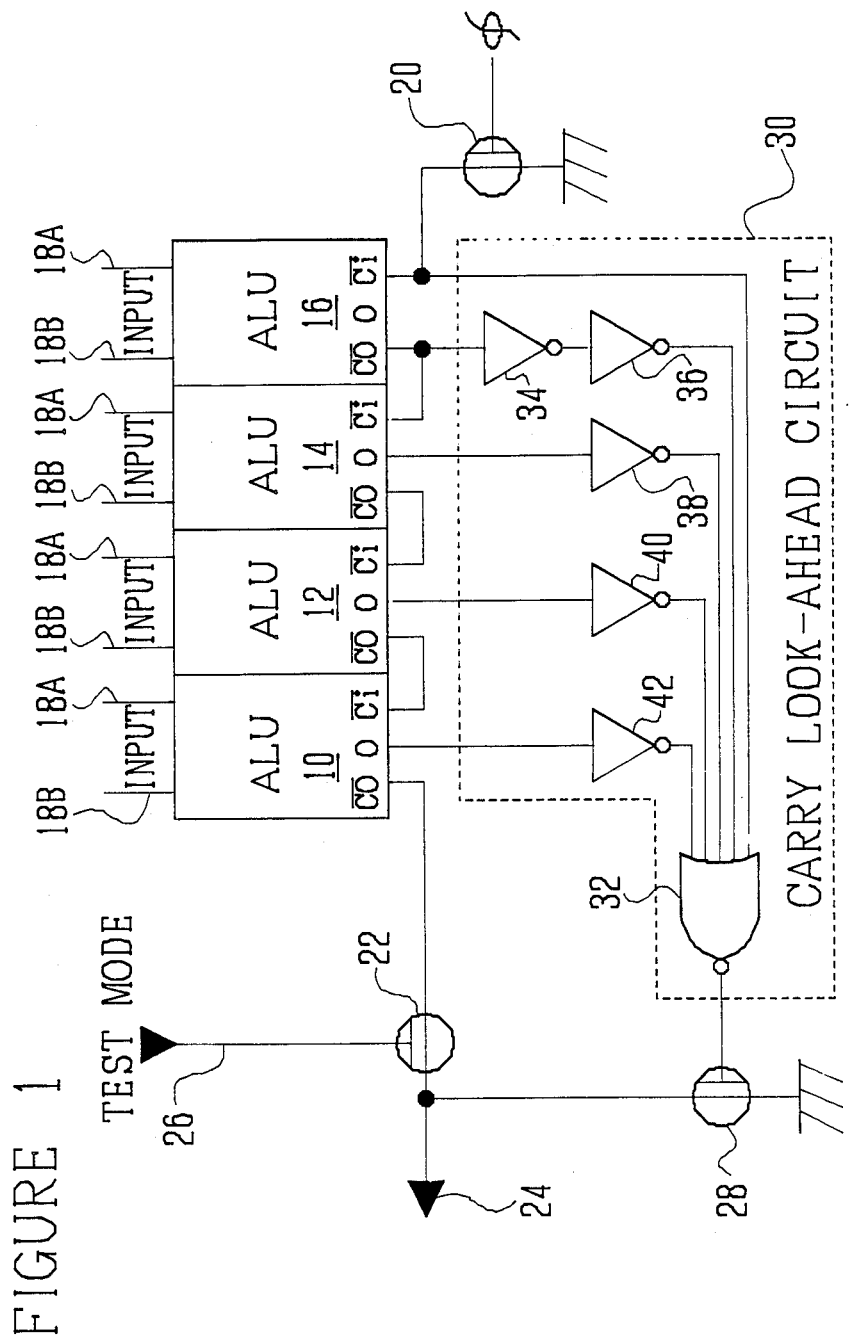
FIG. 1 is a block diagram of a first embodiment of the arithmetic logic system in accordance with the present invention.

Referring to FIG. 1, there is shown a first embodiment of the arithmetic logic system in accordance with the present invention.

The shown arithmetic logic system comprises four arithmetic logic units (called "ALU" hereinafter) 10, 12, 14 and 16 located in parallel and each having a pair of inputs 18A and 18B for receiving a pair of input bits between which a designated operation is to be executed. Each of the ALUs 10 to 16 has a carry input $\overline{Ci}$, an operation output O and a carry output $\overline{Co}$ and also control inputs (not shown) receiving a control signal (not shown) instructing an operation mode such as addition, subtraction, multiplication, division, a logic operation, etc.

The ALU 16 located at the least significant bit position is connected at its carry input $\overline{Ci}$ to ground through a n-channel transfer gate 20 which receives at its gate a clock $\phi$ so that a borrow signal is applied to the least significant bit ALU. The ALU 16 is connected at its carry output $\overline{Co}$ to the carry input $\overline{Ci}$ of the adjacent more significant bit ALU 14. The carry output $\overline{Co}$ of the ALU 14 is connected to the carry input $\overline{Ci}$ of the adjacent more significant bit ALU 12, and the carry output $\overline{Co}$ of the ALU 12 is connected to the carry input $\overline{Ci}$ of the adjacent more significant bit or the most significant bit ALU 10. The carry output $\overline{Co}$ of the ALU 10 is connected through another n-channel transfer gate 22 to an output 24 for sending a carry signal to a next stage of ALU not shown. Thus, a carry transfer path is formed in association with the arithmetic logic system. The transfer gate 22 is connected to receive at its gate a test mode signal 26 of a negative logic. The carry signal output 24 of the system is connected to ground through a third n-channel transfer gate 28 having a gate connected to an output of a carry look-ahead circuit 30.

The carry look-ahead circuit 30 includes a five-input NOR circuit 32 having an output connected to the gate of the transfer gate 28. A first input of the NOR circuit 32 is connected to the carry input $\overline{Ci}$ of the least significant bit ALU 16, and a second input of the NOR circuit 32 is connected through a pair of cascaded inverters 34 and 36 to the carry output $\overline{Co}$ of the same ALU 16. In addition, the third to fifth inputs of the NOR circuit 32 are connected through inverters 38, 40 and 42 to the operation outputs O of the other ALUs 14, 12 and 10, respectively. This carry look-ahead circuit 30 having the above mentioned construction generates a high logic level signal when a carry look-ahead condition is satisfied.

Thus, a four-bit arithmetic logic system having the carry look-ahead circuit and provided with the test circuit in accordance with the present invention is constructed. The system is of a negative logic and of so called "dynamic type" in which it is precharged when the clock $\phi$ is at a low level and an operation is executed for a period that the clock $\phi$ is at a high level.

Next, operation will be explained.

First, assume that the data inputs 18A and 18B of the four ALUs 10 to 16 are applied with such inputs which cause the carry output $\overline{Co}$ of the least significant bit ALU 16 to output a signal of "0" and the operation outputs O of the other ALUs 10 to 14 to output a signal of "1", respectively. In this condition, when the clock $\phi$ is brought to the high level, the carry look-ahead circuit 30, namely the NOR circuit 32, outputs a high level signal to the transfer gate 28, so that the output 24 of the carry transfer path is brought to a low level, namely is rendered active. On the other hand, if the test mode signal 26 is at a high level so as to maintain the transfer gate 22 in an on condition, a carry which has propagated through the insides of the ALUs 16 to 10 is outputted through the transfer gate 22 to the carry signal output 24. Therefore, the carry signal output 24 is brought into the low level not only by the transfer gate 28 turned on by the carry look-ahead circuit 30 but also by the carry which has propagated through the insides of the ALUs 16 to 10.

At this time, accordingly, if a failure has occurred in the carry look-ahead circuit 30, the transfer gate 28 will not be turned on. But, the carry signal output 24 is brought into the low level, namely rendered active, by the carry which has propagated through the insides of the ALUs 16 to 10. In this case, since the carry is correctly transferred although the carry transfer speed is low, a correct result of operation will be obtained.

However, if the test mode signal 26 of a low level is applied to the gate of the transfer gate 22 so as to turn off the transfer gate 22, the carry signal output 24 is brought into the low level by only the transfer gate 28 turned on by the carry look-ahead circuit 30. Therefore, in this condition, if a failure has occurred in the carry look-ahead circuit 30, the carry is not correctly transferred to the carry signal output 24 for the next stage of ALU. Accordingly, a correct result operation will not be obtained as a result of the failure of the carry look-ahead circuit 30.

As seen from the above explanation, the carry look-ahead circuit associated to the arithmetic system can be tested by controlling the transfer gate 22 by the test mode signal and by monitoring the result of the operation.

Figure 2:
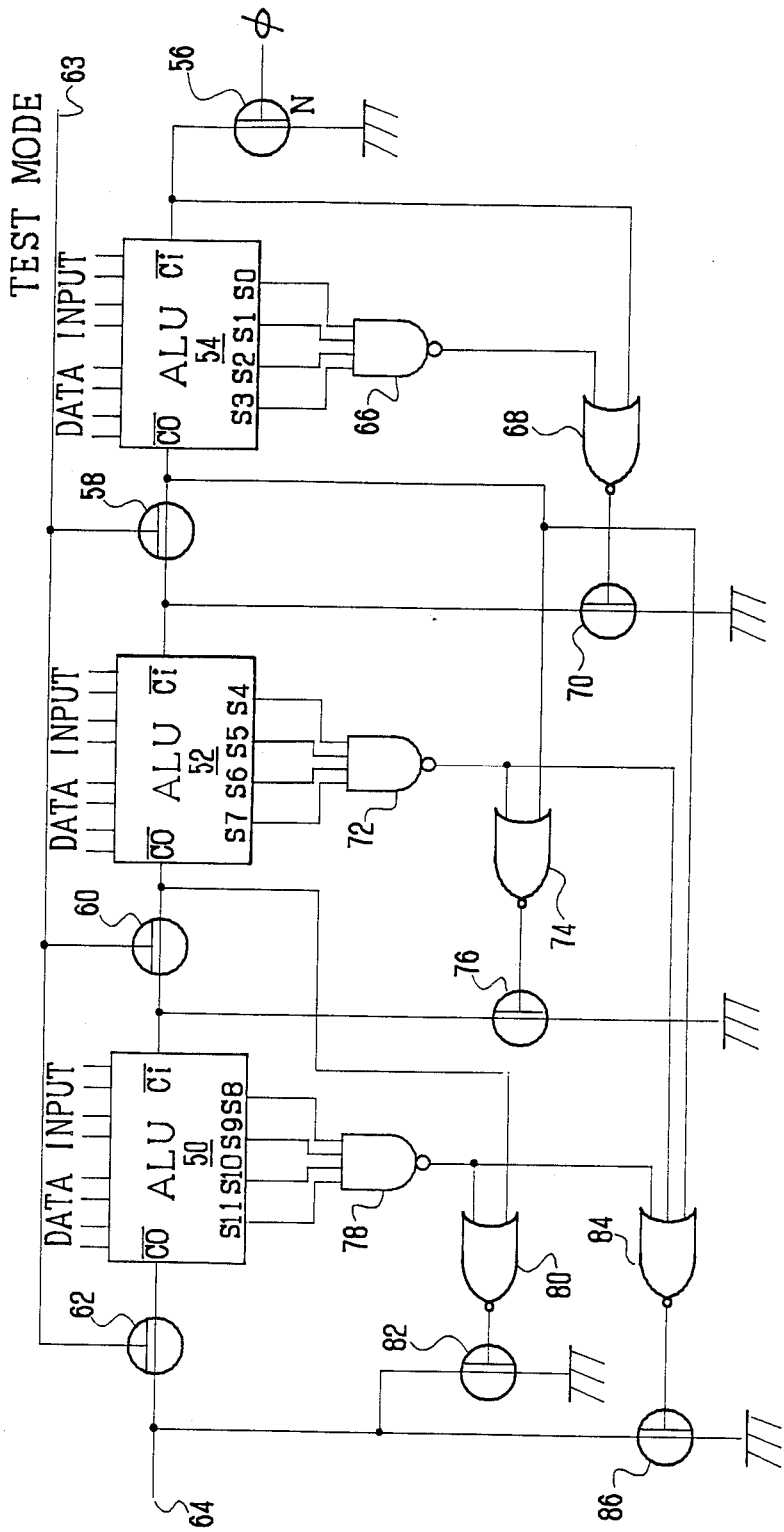
FIG. 2 is a block diagram of a second embodiment of the arithmetic logic system in accordance with the present invention.

Referring to FIG. 2, there is shown a second embodiment of the arithmetic logic system in accordance with the present invention.

The shown system includes three four-bit ALU blocks 50, 52 and 54, each of which substantially corresponds to the system shown in FIG. 1. The ALU block 54 located at the least significant bit position has a carry input $\overline{Ci}$ connected to ground through a n-channel transfer gate 56 which receives at its gate a clock $\phi$ so that a borrow signal is applied for the least significant bit. The ALU block 54 also has a carry output $\overline{Co}$ connected through a n-channel transfer gate 58 to a carry input $\overline{Ci}$ of the adjacent more significant bit ALU block 52. A carry output $\overline{Co}$ of the ALU block 52 is connected through a transfer gate 60 to a carry input $\overline{Ci}$ of the adjacent more significant bit or the most significant bit ALU block 50. A carry output $\overline{Co}$ of the ALU block 50 is connected through a n-channel transfer gate 62 to an output 64 for sending a carry signal to a next stage of ALU block not shown. Thus, a carry transfer path is formed to pass through the insides of the ALU blocks 50 to 54.

Each of the transfer gates 58 to 62 has a gate connected to receive a test mode signal 63 of a negative logic.

Further, each of the four-bit ALU blocks 50 to 54 has four operation outputs for respective input bits. Specifically, the ALU block 54 has four operation outputs S0, S1, S2 and S3, which are connected to four inputs of a NAND circuit 66. This NAND circuit 66 is connected at its output to one input of a NOR circuit 68, whose other input is connected to the carry input $\overline{Ci}$ of the ALU block 54. An output of the NOR circuit 58 is connected to a gate of a n-channel transfer gate 70, which is connected at its one end to the carry input $\overline{Ci}$ of the ALU block 52 and at its other end to ground.

Further, the ALU block 52 has four operation outputs S4, S5, S6 and S7, which are connected to four inputs of another NAND circuit 72. This NAND circuit 72 is connected at its output to one input of another NOR circuit 74, whose other input is connected to the carry output $\overline{Co}$ of the ALU block 54. An output of the NOR circuit 74 is connected to a gate of a n-channel transfer gate 76, which is connected at its one end to the carry input $\overline{Ci}$ of the ALU block 50 and at its other end to ground.

In addition, the ALU block 50 has four operation outputs S8, S9, S10 and S11, which are connected to four inputs of a third NAND circuit 78. This NAND circuit 78 is connected at its output to one input of a third NOR circuit 80, whose other input is connected to the carry output $\overline{Co}$ of the ALU block 52. An output of the NOR circuit 80 is connected to a gate of a n-channel transfer gate 82 which is connected at its one end to the carry signal output 64 and at its other end to ground.

Furthermore, there is provided a three-input NOR circuit 84 having three inputs connected to the carry output $\overline{Co}$ of the ALU block 54 and the outputs of the NAND circuits 72 and 78, respectively. This NOR gate 84 is connected at its output to a gate of a n-channel transfer gate 86 which is connected at its one end to the carry signal output 64 and at its other end to ground.

In the above mentioned system, thus, the circuit elements 66, 68, 72, 74 78, 80 and 84 form a carry look-ahead circuit.

Now, operation of the above mentioned system will be explained. Similarly to the first embodiment shown in FIG. 1, the system shown in FIG. 2 is such that it is precharged when the clock $\phi$ is at a low level and an operation is executed for a period that the clock $\phi$ is at high level. In addition, in a normal operation (i.e., in a non-testing condition), the test mode signal 63 is at a high level so that the transfer gates 58, 60 and 62 are maintained in an on condition.

If a carry look-ahead condition for the ALU block 54 is satisfied, low level signals are inputted to both of the two inputs of the NOR circuit 68, respectively, so that transfer gate 70 is turned on, so that a carry line between the ALU blocks 52 and 54 is brought into a ground level. Namely, a carry signal is transferred to the ALU block 54. In addition, if a carry look-ahead condition for the ALU block 52 is satisfied, the NOR circuit 74 receive low level signals at their two inputs, respectively, so that transfer gate 76 is turned on, so that a carry line between the ALU blocks 50 and 52 is brought into a ground level. Further, if a carry look-ahead condition for the ALU block 50 is satisfied, the two inputs of the NOR circuit 80 receive low level signals, respectively, so that the transfer gate 82 is turned on, so that the carry signal output 64 is brought into a ground level.

In addition to the above mentioned operation of the carry look-ahead circuit, if the carry is propagated through all the ALU blocks, namely, if the carry input $\overline{C}i$ of the ALU block 54 is of "0" and all the NAND circuits 66, 72 and 78 generate active outputs (i.e., a low level signal), respectively if the carry look-ahead condition is satisfied in all the ALU blocks 50, 52 and 54), this is detected by the NOR circuit 84. If it is detected, the NOR circuit 84 generates a high level signal to the gate of the transfer gate 86, so that the carry signal output 64 is grounded, i.e., is rendered active.

When the test mode signal 63 is at a high level so that the transfer gates 58, 60 and 62 are maintained in an on condition, the above mentioned operation will not subjected to any influence. In addition, a carry will propagate through the inside of the ALU blocks 54 to 50

On the other hand, if the test mode signal 63 is brought to a low level so that the transfer gates 58, 60 and 62 are brought into an off condition. As a result, the carry can propagate through only the carry look-ahead circuit. Therefore, if any failure occurs in the carry look-ahead circuit, a correct result of operation cannot be obtained, and accordingly, a failure can be easily detected.

In the embodiment shown in FIG. 2, however, there are two paths for discharging the carry signal output 64. Therefore, if only one of the two discharge paths has a failure, it can be deemed that the carry look-ahead circuit normally operates as a whole. However, it is possible to turn on a selected one of the transfer gate 82 and the transfer gate 86 for discharging the carry signal output 64, by selecting the data which is inputted to the ALU blocks 50 to 54.

In other words, if the ALU block 54 is supplied with an input data which causes the ALU block 54 to generate an signal of "1" at its carry output $\overline{C}o$, the NOR circuits 74 and 84 will output a signal of "0". Accordingly, the transfer gates 76 and 86 are maintained off. On the other hand, there is supplied to the ALU block 52 an input data which causes the ALU block 52 to generate an signal of "0" at its carry output $\overline{C}o$, and the ALU block 50 is supplied with an input data which causes the NAND circuit 78 to generate an output signal of "0". One typical example of the above input data is "0" and "F" in a hexadecimal notation in the case of an addition. In this case, the NOR circuit 80 ought to output a signal of "1", and therefore, the transfer gate 82 ought to be turned on. Thus, whether or not a portion of the carry look-ahead circuit (namely, the portion associated to the ALU block 50) normally operates can be detected by checking the carry signal output 64 and hence the result of the operation on the given input data.

In the case of testing the carry look-ahead signal path for discharging the carry signal output 64 by the transfer gate 86, the ALU block 50 is supplied with an input data which causes the NAND circuit 78 to output an signal of "0". There is supplied to the ALU block 52 an input data which causes the ALU block 52 to generate an signal of "1" at its carry output $\overline{C}o$ and the NAND gate 72 to generate an output signal of "0". In addition, the ALU block 54 is supplied with an input data which causes the ALU block 54 to generate an signal of "0" at its carry output $\overline{C}o$ and the NAND circuit 66 to generate an output signal of "1". In this case, the transfer gate 86 ought to be turned on. Thus, whether or not a portion of the carry look-ahead circuit (namely, the portion including the NOR circuit 84) normally operates can be detected by checking the carry signal output 64 and hence the result of the operation on the given input data.

As is apparent from the above, the arithmetic logic system in accordance with the present invention has a test circuit composed of a small amount of hardware and can cause to generate an error in the result of operation when any failure occurs in the carry look-ahead circuit, by applying a simple test pattern to the input of the arithmetic logic system. Therefore, the operation test of the carry look-ahead circuit provided in the arithmetic logic system can be easily executed.

The invention has thus been shown and described with reference to the specific embodiments. However, it should be noted that the present invention is in no way limited to the details of the illustrated structures but changes and modifications may be made within the scope of the appended claims.

I claim:

1. An arithmetic logic system which includes a plurality of arithmetic logic units, arranged in series from most significant bit (MSB) to least significant bit (LSB) positions, for processing data composed of a corresponding number of bits and having a path for transferring a carry through the respective arithmetic logic units, said system further including a carry look-ahead circuit provided in parallel to the carry transfer path and having inputs respectively connected to the arithmetic logic units for generating a carry look-ahead signal when a carry look-ahead condition is realized, said system comprising a carry signal output connected to a most significant end of said carry transfer path, a first transfer gate connected at its one end to said carry signal output and at its other end to a predetermined voltage and operating in response to said carry look-ahead signal so as to connect said carry signal output to said predetermined voltage, and a second transfer gate connected between said carry signal output and said most significant end of said carry transfer path and operating in response to a test mode signal to isolate said carry signal output from said carry transfer path, whereby when said carry signal output is isolated from said carry transfer path by said second transfer gate, a carry is transferred through only said carry look-ahead circuit to said carry signal output.

2. An arithmetic logic system claimed in claim 1 wherein the least significant bit arithmetic logic unit of said arithmetic logic units has a carry input connected to ground through a third transfer gate whose gate is connected to receive a clock, and the most significant bit arithmetic logic unit of said arithmetic logic units has a carry output connected through said second transfer gate to said carry signal output, each pair of adjacent arithmetic logic units being connected in such a manner that a carry output of a less significant bit arithmetic logic unit of said arithmetic logic unit pair is connected to a carry input of a more significant bit arithmetic logic unit of said arithmetic logic unit pair.

3. An arithmetic logic system claimed in claim 2 wherein the other end of said first transfer gate is connected to said predetermined voltage and wherein said carry look-ahead circuit includes a NOR circuit having at least three inputs and an output which is connected to a gate of said first transfer gate, two inputs of said NOR circuit being connected to the carry input and the carry output of said least significant bit arithmetic logic unit, respectively, and the other input of said NOR circuit being connected to operation output of the other arithmetic logic unit through inverter, respectively.

4. An arithmetic logic system comprising:
a plurality of arithmetic logic unit blocks, arranged in series from most significant bit to least significant bit, each receiving a pair of input data composed of a plurality of bits and having a carry input, a carry output and a plurality of operation outputs corresponding to the bit number of each input data, each pair of arithmetic logic unit blocks being connected in such a manner that the carry output of a less significant bit arithmetic logic unit block of said arithmetic logic unit block pair is connected to the carry input of a more significant bit arithmetic logic unit block of said arithmetic logic unit block pair,
a carry signal output connected to the carry output of the most significant bit arithmetic logic unit block through a first transfer gate which operates in response to a test mode signal to interrupt between said carry signal output and the carry output of said most significant bit arithmetic logic unit block;
a carry look-ahead circuit in response to said operation outputs of said arithmetic logic unit blocks for generating a carry look-ahead signal when a carry look-ahead condition is realized; and
a second transfer gate connected at its one end to said carry signal output and at its other end to a predetermined voltage and operating in response to said carry look-ahead signal so as to connect said carry signal output to said predetermined voltage,
whereby when said carry signal output is separated from said carry output of said most significant bit arithmetic logic unit block by said first transfer gate, a carry is transferred through only said carry look-ahead circuit.

5. An arithmetic logic system claimed in claim 4 wherein the carry output of the less significant bit arithmetic logic unit block of said each arithmetic logic unit block pair is connected to the carry input of the more significant bit arithmetic logic unit block of said each arithmetic logic unit block pair, through a third transfer gate which operates in response to said test mode signal to interrupt between the arithmetic logic unit blocks of said each arithmetic logic unit block pair.

6. An arithmetic logic system claimed in claim 5 wherein said each arithmetic logic unit block pair includes a fourth transfer gate connected at its one end to a predetermined voltage and at its other end to the carry input of the more significant bit arithmetic logic unit block of said each arithmetic logic unit block pair, a NOR gate having an output connected to a gate of said fourth transfer gate, said NOR gate having two inputs, one of which is connected to the carry output of the next less significant bit arithmetic logic unit block adjacent to the less significant bit arithmetic logic unit block of said each arithmetic logic unit block pair, and a NAND circuit having an output connected to the other input of said NOR gate and inputs connected to said operation outputs of the less significant bit arithmetic logic unit block of said each arithmetic logic unit block pair.

7. An arithmetic logic system claimed in claim 6 wherein said second transfer gate has a gate connected to an output of a further NOR gate having a plurality of inputs, one of the inputs of said further NOR gate being connected to said carry output of the least significant bit arithmetic logic unit block, and the other inputs of said further NOR gate are connected to outputs of the NAND circuits respectively connected to all the arithmetic logic unit blocks excluding the least significant bit arithmetic logic unit block.

* * * * *

UNITED STATES PATENT AND TRADEMARK OFFICE
CERTIFICATE OF CORRECTION

PATENT NO. : 4,876,661
DATED : October 24, 1989
INVENTOR(S) : Koya

It is certified that error appears in the above-identified patent and that said Letters Patent is hereby corrected as shown below:

Column 1, line 67, delete "precessing" and insert --processing--.

Signed and Sealed this

Twelfth Day of February, 1991

Attest:

HARRY F. MANBECK, JR.

*Attesting Officer*   Commissioner of Patents and Trademarks